United States Patent [19]
Yates

[11] Patent Number: 5,939,336
[45] Date of Patent: Aug. 17, 1999

[54] AQUEOUS SOLUTIONS OF AMMONIUM FLUORIDE IN PROPYLENE GLYCOL AND THEIR USE IN THE REMOVAL OF ETCH RESIDUES FROM SILICON SUBSTRATES

[75] Inventor: Donald L. Yates, Boise, Id.

[73] Assignee: Micron Technology, Inc., Boise, Id.

[21] Appl. No.: 09/138,045

[22] Filed: Aug. 21, 1998

[51] Int. Cl.$^6$ ..................................................... C09K 13/00
[52] U.S. Cl. ........................ 438/753; 252/79.1; 252/79.5; 438/745
[58] Field of Search ................................. 252/79.1, 79.5; 438/745, 753

[56] References Cited

U.S. PATENT DOCUMENTS

| | | |
|---|---|---|
| 3,979,241 | 9/1976 | Maeda et al. ........................... 252/79.1 |
| 4,087,367 | 5/1978 | Rioult et al. . |
| 4,165,295 | 8/1979 | Vander Mey . |
| 4,215,005 | 7/1980 | Vander Mey . |
| 4,269,654 | 5/1981 | Deckert et al. . |
| 4,343,677 | 8/1982 | Kinsbron et al. . |
| 4,351,698 | 9/1982 | Osborne . |
| 4,517,106 | 5/1985 | Hopkins et al. . |
| 4,569,722 | 2/1986 | Maury et al. . |
| 4,620,934 | 11/1986 | Hopkins et al. . |
| 5,219,791 | 6/1993 | Freiberger . |
| 5,320,709 | 6/1994 | Bowden et al. ........................ 252/79.1 |
| 5,328,871 | 7/1994 | Tanigawa et al. . |
| 5,376,236 | 12/1994 | Hanson et al. . |
| 5,476,816 | 12/1995 | Mautz et al. . |
| 5,478,436 | 12/1995 | Winebarger et al. . |
| 5,571,447 | 11/1996 | Ward et al. . |
| 5,603,849 | 2/1997 | Li . |
| 5,698,503 | 12/1997 | Ward et al. . |
| 5,709,756 | 1/1998 | Ward et al. . |
| 5,716,535 | 2/1998 | Lee et al. . |
| 5,770,523 | 6/1998 | Hung et al. . |

*Primary Examiner*—Benjamin Utech
*Assistant Examiner*—Bernadine Okoro
*Attorney, Agent, or Firm*—Killworth, Gottman, Hagan & Schaeff, L.L.P.

[57] ABSTRACT

Compositions of ammonium fluoride, propylene glycol, and water and methods of using these compositions to remove etch residues from silicon substrates which result from plasma or reactive ion etching of silicon substrate are provided. Not only do the compositions of the present invention overcome the environmental concerns associated with the use of ethylene glycol, but unlike previous compositions of ammonium fluoride in propylene glycol which are acidic, the compositions of the present invention are neutral to slightly basic (i.e., pH 7 to about pH 8). Hence, they remove etch residues from silicon substrates with minimal attack on other features on the silicon substrates.

25 Claims, No Drawings

AQUEOUS SOLUTIONS OF AMMONIUM FLUORIDE IN PROPYLENE GLYCOL AND THEIR USE IN THE REMOVAL OF ETCH RESIDUES FROM SILICON SUBSTRATES

FIELD OF THE INVENTION

This invention relates to aqueous solutions of ammonium fluoride in propylene glycol and to their use in removing etch residues created in processing of silicon substrates.

BACKGROUND OF THE INVENTION

Plasma-etching and/or reactive ion etching of silicon substrates can result in etch residues. For example, plasma-etching and/or reactive ion etching of metals or metal alloys on silicon substrates can create etch residues containing metal. These residues are undesirable, as they impair the resolution of desirable features on the silicon substrate and shorten device life. Therefore, it is desirable to remove these residues.

When etching layers on a silicon substrate, distinctly different etch residues are created as the plasma or reactive ion etch attacks each film or layer in the silicon substrate in succession. Therefore, most etch residues resulting from plasma or reactive ion etching are composed of distinctly different residues. Unfortunately, most solutions used to remove these etch residues suffer from a lack of selectivity. For example, most solutions attack some residues less aggressively than others. However, if longer dip times are employed to remove the more difficult residues, these solutions begin to attack other features on the substrate.

In an effort to increase selectivity and control, various solutions for removing etch residues have been developed. For example, U.S. Pat. No. 5,320,790 Bowden et al. teach the selective removal of etch residues with a polyhydric alcohol containing 0.5% to 10% anhydrous ammonium fluoride salt. Bowden et al. teach that the selectivity observed is due to the presence of little (<4%) or no water. Bowden et al. teach that because there is little or no water present, essentially no $H_3O^+$ is formed and the small amount of HF evolved does not ionize. Therefore, the solution is essentially neutral and hence, removal rates of the etch residues are slower. In addition, Bowden et al. teach that smaller amounts of ammonium fluoride yield slower etch residue removal rates, and larger amounts may be used but are limited by the solubility of ammonium fluoride in the polyhydric alcohol. Further, while Bowden et al. teach anhydrous solutions of ammonium fluoride in various polyhydric alcohols, they disclose only ethylene glycol solutions containing 4% anhydrous ammonium fluoride.

Due to environmental concerns, the use of ethylene glycol is problematic. Although higher order polyhydric alcohols do not share the environmental concerns associated with the use of ethylene glycol, the use of higher order polyhydric alcohols in solvents intended to remove etch residues is not straightforward. For example, anhydrous solutions of ammonium fluoride in higher order polyhydric alcohols less efficient in removing etch residues. Anhydrous solutions of ammonium fluoride in higher order polyhydric alcohols tend to exhibit slower etch residue removal rates when compared to the etch residue removal rates of anhydrous solutions of ammonium fluoride in ethylene glycol. These slower etch residue removal rates are due to the lower solubility of anhydrous ammonium fluoride in higher order polyhydric alcohols as compared with solutions of anhydrous ammonium fluoride in ethylene glycol. Because anhydrous ammonium fluoride is less soluble in anhydrous higher order polyhydric alcohols than in anhydrous ethylene glycol, anhydrous solutions of ammonium fluoride in higher order polyhydric alcohols necessarily contain less ammonium fluoride then do anhydrous solutions of ammonium fluoride in ethylene glycol. Hence, etch residue removal rates are slower and the higher order polyhydric alcoholic solutions are not as efficient as anhydrous solutions of ammonium fluoride in ethylene glycol in removing etch residues.

The problems of etch residue removal efficiency and etch residue removal rates associated with the use of anhydrous solutions of ammonium fluoride in higher order polyhydric alcohols can be overcome by the addition of water. For example, when comparing like-polyhydric alcoholic solutions, it is possible to obtain higher concentrations of ammonium fluoride in aqueous solutions than in anhydrous solutions due to the higher solubility of ammonium fluoride in such aqueous solutions. Hence, when comparing like-polyhydric alcoholic solutions, faster etch residue removal rates and etch residue removal efficiencies are possible with aqueous solutions of ammonium fluoride then with anhydrous solutions of ammonium fluoride.

Aqueous solutions of ammonium fluoride in polyhydric alcohols exhibit several other advantages over anhydrous solutions of ammonium fluoride in like-polyhydric alcohols. For example, anhydrous solutions of ammonium fluoride in polyhydric alcohols, including ethylene glycol, are relatively viscous. Therefore, the wetting capabilities of these anhydrous solutions are more limited. Wetting capabilities are directly related to the rate of initiation of the etch residue removal process. Since it is usually desirable to have the etch residue removal process initiate rapidly, it is advantageous for a solution intended to remove etch residues to exhibit increased wetting capabilities. In addition, because the anhydrous solutions are relatively viscous, removal of the polyhydric alcohol solution from the substrate after the etch residue removal process with a simple water rinse can be problematic. The addition of water to polyhydric alcoholic solutions of ammonium fluoride improves not only wetting capabilities and rinsability, but also increases bath life. For example, when comparing like-polyhydric alcoholic solutions, aqueous solutions of ammonium fluoride are less viscous then anhydrous solutions of ammonium fluoride. Therefore, when comparing like-polyhydric alcoholic solutions, aqueous solutions of ammonium fluoride exhibit greater wetting capabilities then do anhydrous solutions of ammonium fluoride. In addition, this lower viscosity of the etch solution leads to increased rinsability after the substrate is removed from the solution. Because aqueous solutions of ammonium fluoride in polyhydric alcohols are less viscous then anhydrous solutions (when compared with like polyhydric alcohols), less water or other rising fluid is required to displace the polyhydric alcohol from the exposed surface of the substrate. Further, because fluoride ion is consumed during the etching process, the higher concentrations of ammonium fluoride which may be obtained in aqueous solutions as compared with anhydrous solutions can result increased bath life.

Aqueous solutions of ammonium fluoride in higher order polyhydric alcohols are known. For example, U.S. Pat. No. 5,698,503 to Ward et al. teach acidic (pH >4 but <7) aqueous compositions for the controlled removal of etch residues comprising a polyhydric alcohol (excluding ethylene glycol), an organic water soluble polar solvent, and ammonium fluoride. In addition, Ward et al. teach that the use of an organic water soluble polar solvent allows use of ammonium fluoride in the formulation when propylene glycol is the polyhydric alcohol. In addition, U.S. Pat. No. 5,571,447 to Ward et al. discloses acidic (pH <5) compositions for the controlled removal of etch residues comprising a polyhydric alcohol (excluding ethylene glycol), fluoboric acid ($HBF_4$), and a small amount of fluoride salt, including ammonium fluoride, in polar solvents. Ward et al. teach that the fluoboric acid is an essential component of the composition in that it maintains a stable fluoride ion source with ammonium fluoride or other fluoride salts and provides the needed low pH of the composition. In addition, Ward et al. teach that the use of water or water/dimethylsulfoxide (DMSO) mixtures allows use of ammonium fluoride in the formulation when propylene glycol is the polyhydric alcohol. Ward et al. further teach that the compositions are water soluble, non-corrosive to the substrate, non-flammable and of low toxicity to the environment.

However, as taught by Bowden et al. in U.S. Pat. No. 5,320,709, acidic solutions of ammonium fluoride, like those taught by Ward et al. in U.S. Pat Nos. 5,698,503 and 5,571,447 result in a loss of selectivity and control. Therefore, acidic solutions of ammonium fluoride in polyhydric alcohols, such as taught by Ward et al. in U.S. Pat. Nos.5,698,503 and 5,571,447, are not compatible with certain features typically present on silicon substrates in the process of fabrication. For example, aluminum and dielectrics are generally attacked when exposed to acidic fluorinated solutions by the hydrogen fluoride (HF) which is present in such solutions. Therefore, when such susceptible features are present on the silicon substrate, it is often necessary that corrosion inhibitors, such as catechol and pyrogallol, be added to the acidic fluorinated solution to inhibit such attack. Very basic solutions can attack aluminum as well, and many basic chemistries also contain corrosion inhibitors.

In addition to the ammonium fluoride solutions of Bowden et al. and Ward et al. discussed above, other solutions of ammonium fluoride in polyhydric alcohols are known. However, these solutions are not known to be useful for removing etch residues from silicon substrates which result from plasma or reactive ion etching of silicon substrates. In addition, these solutions differ from those of the present invention in that they are anhydrous in nature, contain ethylene glycol, and/or have a pH of less than 7. For example, U.S. Pat. No. 3,979,241 to Maeda et al. discloses an anhydrous solution of ammonium fluoride in ethylene glycol useful for etching silicon dioxide and silicon nitride; U.S. Pat. No. 4,087,367 to Rioult et al. discloses an anhydrous solution of ammonium fluoride in ethylene glycol useful for selective removal of aluminum oxide; U.S. Pat. No. 4,165,295 to Vander Mey teaches solutions containing organic sulfonic acids in combination with fluoride ions, including ammonium fluoride, in organic solvents useful for stripping photoresists from metallized inorganic substrates; U.S. Pat. No. 4,343,677 to Kinsbron et al. discloses liquid compositions of ammonium fluoride and hydrofluoric acid useful for buildups of silicon oxides; and U.S. Pat. No. 5,376,236 to Hanson et al. discloses aqueous solutions of hydrofluoric acid and ammonium fluoride in propylene glycol useful for etching titanium. In addition, MICROSTRIP 5003, available from Olin, is an aqueous solutions containing ethylene glycol and ammonium fluoride and is known as being useful as an oxide etchant. Further, the NOE series of products, available from Allied Chemical Sciences, Inc., are anhydrous solutions of ammonium fluoride in ethylene glycol or propylene glycol and are known as being useful for etching oxides.

Therefore, there exists a need in the art for compositions which remove etch residues created during plasma-etching and/or reactive ion etching of silicon substrates which overcome the environmental concerns associated with the use of ethylene glycol and which are compatible with other features normally present on a silicon substrate.

SUMMARY OF THE INVENTION

The present invention provides compositions of ammonium fluoride, propylene glycol, and water. These compositions are useful in removing etch residues from silicon substrates which result from plasma or reactive ion etching of silicon substrates (i.e., etch residues). Not only do the compositions of the present invention overcome the environmental concerns associated with the use of ethylene glycol, but unlike previous compositions of ammonium fluoride in propylene glycol which are acidic, the compositions of the present invention are neutral to slightly basic (i.e., pH 7 to about pH 8). Hence, they remove etch residues from silicon substrates with minimal attack on other features on the silicon substrates. In neutral or slightly basic fluorinated solutions, the fluoride is present in the solution substantially as fluoride ion ($F^-$). Addition of corrosion inhibitors to a neutral or basic fluorinated solutions is not necessary because fluoride ion does not aggressively attack sensitive features such as aluminum and dielectrics as does the HF present in acidic fluorinating solutions.

Thus, in one embodiment of the present invention there is provided a composition having a pH of from 7 to about 8 which comprises ammonium fluoride, propylene glycol, and water.

In another embodiment, there is provided a composition having a pH of from 7 to about 8 which comprises ammonium fluoride, propylene glycol, water and a buffering agent.

In yet another embodiment, there is provided a method for removing etch residues from a silicon substrate which comprises contacting a silicon substrate with a composition having a pH of from 7 to about 8 which comprises ammonium fluoride, propylene glycol, and water for a period of time necessary to remove said etch residues.

In still yet another embodiment, there is provided a method for removing etch residues from a silicon substrate which comprises contacting a silicon substrate with a composition having a pH of from 7 to about 8 which comprises ammonium fluoride, propylene glycol, water, and a buffering agent for a period of time necessary to remove said etch residues.

DETAILED DESCRIPTION OF THE INVENTION

As used herein, the term "silicon substrate" refers to silicon structures, including silicon wafers, silicon structures in the process of fabrication, any layer on a silicon substrate which is in the process of fabrication, a semiconductor layer, including a semiconductor layer in the process of fabrication, and the like.

As used hereinafter, the term "removing etch residues", "removal of etch residues", and "remove etch residues" includes, but is not limited to a 100% removal of the etch residues.

As used herein, the term "etch residues" refers to any chemical compound or combination of chemical compounds present on silicon substrate which result from either plasma etching or reactive ion etching processes carried out on a silicon substrate and includes, but is not limited to, oxidized organometallic polymers, oxidized organosilicon polymers, native oxides, and damaged oxides.

As used herein, the term "contacting" refers to any means of bringing the silicon substrate and the compositions of the present invention together physically and includes, but is not limited to, immersing, spraying, micro-droplet fogging, and the like.

The compositions of the present invention comprise ammonium fluoride, propylene glycol, and water and have a pH of from 7 to about 8, preferably have a pH of from about 7.5 to about 7.9, and more preferably, have a pH of from about 7.6 to about 7.8, wherein the propylene glycol comprises from about 50 wt % to about 90 wt %, preferably from about 55 wt % to about 75 wt %, and more preferably from about 60 wt % to about 70 wt % of the composition, wherein the ammonium fluoride comprises from about 5 wt % to about 20 wt %, preferably from about 8 wt % to about 18 wt %, and more preferably from about 10 wt % to about 15 wt % of the composition, and wherein water comprises from about 10 wt % to about 30 wt %, preferably from about 15 wt % to about 25 wt %, and more preferably from about 18 wt % to about 22 wt %. A preferred composition of the present invention comprises about 65 wt % propylene glycol, about 21 wt % water, and about 14 wt % ammonium fluoride and a more preferred composition of the present invention comprises about 65.2 wt % propylene glycol, about 20.9 wt % water, and about 13.9 wt % ammonium fluoride. The compositions of the present invention may be prepared by techniques and procedures well known by one of ordinary skill in the art. For example, the compositions of the present invention may be prepared by first preparing an aqueous solution of ammonium fluoride of known concentration, and then mixing this aqueous solution of ammonium fluoride with an appropriate amount of propylene glycol to make the final composition. Alternatively, aqueous solutions of ammonium fluoride which are commercially available may be used in the preparation of certain of the compositions of the present invention.

In order that the benefits of an aqueous composition of ammonium fluoride in propylene glycol may be realized without a loss of selectivity, the compositions of the present invention have a pH of 7 to about 8. Aqueous compositions of ammonium fluoride in propylene glycol having a pH of 7 or below have sufficient hydrofluoric acid (HF) present such that other sensitive features, such as aluminum and dielectrics, are more aggressively attacked during the removal of etch residues. However, at a pH of 7 to about 8, dielectric attack is minimized and aluminum retains a state of oxide passivation ($Al_2O_3$).

The solutions of the present invention may exhibit a pH of 7 to about 8 upon their preparation. This is especially likely when the aqueous solution of ammonium fluoride used in the preparation of the composition itself has a pH above about 7. Preferably, aqueous solutions of ammonium fluoride having a pH of 8, and more preferably 8.1, are utilized in order to ensure a pH of 7 to about 8 in the final composition.

However, for a variety of reasons, aqueous compositions of ammonium fluoride in propylene glycol may exhibit a pH lower than 7. For example, a pH below 7 may result from the use as a starting constituent, an aqueous ammonium fluoride solution having a pH below 7. In addition, a pH below 7 may result from the absorption over time of atmospheric $CO_2$, which results in the presence of carbonic acid in the composition.

In order to maintain a pH of 7 to about 8 for the composition, a buffering agent may optionally be added to the compositions of the present invention. Suitable buffering agents are those buffering agents useful in the pH range of 7 to 9. Suitable buffering agents include, for example, conjugate acid-base pairs, such as tris[hydroxymethyl]-aminoethane and tris[hydroxymethyl]aminoethane hydrochloride salt, available under the tradename TRIZMA from Sigma Chemical. As one of ordinary skill in the art will realize, when the conjugate acid-base pair, such as tris[hydroxymethyl]aminoethane and tris[hydroxymethyl] aminoethane hydrochloride salt, is used as a buffer, the pH at which the combination is useful will be dependent upon the amount of each component used to make the buffer solution. For example, representative amounts of each TRISMA component and the pH at which such combination is useful is given in Table 1.

TABLE 1

Useful pH's of Representative Combinations of TRIZMA base and TRIZMA HCl salt

| pH at 35° C. | Amount of TRIZMA free base, g/l | Amount of TRIZA HCl salt, g/l |
| --- | --- | --- |
| ~7.0 | 0.8 | 6.8 |
| ~7.4 | 1.7 | 5.7 |
| ~7.8 | 3.0 | 4.0 |
| ~8.0 | 3.7 | 3.0 |

In addition, one of ordinary skill in the art will realize that the ability of a given buffering agent to effect a resistance to significant changes in pH when added to the compositions of the present invention will depend on many factors, such as the identity of the conjugate acid-base pair, the total concentration of the buffering species, and to their concentration ratios. Typically however, the concentration of buffering agent in the composition of the present invention will range from about 0.04M to about 0.06M.

In the event that the pH of the composition falls below 7, gaseous ammonia may be introduced into the composition until such time as a pH of 7 to about 8 is achieved. Alternatively, aqueous solutions of ammonia may be added. Of course, if aqueous solutions of ammonia are added, the percentage of propylene glycol and ammonium fluoride in the resulting composition will be decreased accordingly. Preferably, ammonia will be added to the composition when the pH of the composition falls below about 7.4 and will be added until the pH rises to about 7.6 to about 7.8. Further, while the ammonia may be added to the compositions of the present invention during the removal process of the etch residues from the silicon substrates, it is preferred that the buffering agent be added to the composition prior to contacting the silicon substrates with the composition.

The compositions of the present invention are useful in removing etch residues from silicon substrates which result from plasma or reactive ion etching of silicon substrates. Etch residues on silicon substrates are removed by contacting the silicon substrate with any of the compositions of the present invention. Typically, such contact will be accomplished by immersing the silicon substrate into a bath containing a composition of the present invention for a period of time necessary to remove the etch residues. Sonic energy may be optionally applied to the bath during the etching process.

As one of ordinary skill in the art will realize, the time required to remove etch residues will vary according to any number of factors, including the composition and temperature of the particular etching composition utilized as well as the chemical and physical profile of the etch residue, including the nature of the actual chemical compounds created during the plasma or reactive ion etch, the relative percentages of each individual chemical compound present in the residue, the thickness of the etch residue on the silicon substrate, the application of sonic energy, and the like. However, silicon substrates having etch residues thereon are typically contacted with a composition of the present invention for a period of time ranging from about 5 seconds to about 50 minutes, more typically, for a period of time ranging from about 30 seconds to 10 minutes, still more typically, for a period of time range from about 2 minutes to about 4 minutes, and more typically still, for a period of time ranging from about 3.5 minutes to 4 minutes and are typically contacted at a temperature of between about 22° C. to about 50° C., more typically between about 35° C. and 40° C. The silicon substrates may be removed from the bath and inspected, typically by scanning electron microscope (SEM), to determine whether the etch residue has been removed to the desired degree. In the event that SEM reveals insufficient removal of etch residue, the process may be repeated as needed until the desired level of removal is realized.

The following examples 1–5 represent typical compositions of the present invention, but are not intended to limit the scope of the invention in any way.

EXAMPLE 1

Propylene glycol: 82.4 wt %

40% aqueous $NH_4F$, pH≧8: 17.6 wt % (7.0 wt % $NH_4F$ and 10.6 wt % $H_2O$)

EXAMPLE 2

Propylene glycol: 73.8 wt %

40% aqueous $NH_4F$, pH≧8: 26.2 wt % (10.5 wt % $NH_4F$ and 15.7 wt % $H_2O$)

EXAMPLE 3

Propylene glycol: 65.0 wt %

40% aqueous $NH_4F$, pH≧8: 35.0 wt % (14.0 wt % $NH_4F$ and 21 wt % $H_2O$)

EXAMPLE 4

Propylene glycol: 65.2 wt %

40% aqueous $NH_4F$, pH≧8: 34.8 wt % (13.9 wt % $NH_4F$ and 20.9 wt % $H_2O$)

EXAMPLE 5

Propylene glycol: 54.0 wt %

40% aqueous $NH_4F$, pH≧8: 46.0 wt % (18.4 wt % $NH_4F$ and 27.6 wt % $H_2O$)

The following example represents a typical process of the present invention, but is not intended to limit the scope of the invention in any way.

EXAMPLE 6

Prepare the composition of Example 3 and place in an immersion bath equipped with a warming device and warm to 35° C. Immerse a silicon substrate having an etch residue thereon[1] into the bath and allow to stand for 240 seconds. Remove the silicon substrate from the bath and rinse with water or other rinsing fluid.

[1] An example of such a silicon wafer would be a silicon wafer having a aluminum layer overlaid with a $SiO_2$ layer which is in turn overlaid with a photoresist, wherein the wafer has been patterned, dry etched, and the photoresist layer has been stripped off.

What is claimed is:

1. A method for removing etch residues from a silicon substrate comprising contacting said silicon substrate with a composition comprising ammonium fluoride, propylene glycol, and water for a period of time necessary to remove said etch residues, wherein said composition has a pH of from 7 to about 8.

2. A method according to claim 1 wherein the pH of the composition is from about 7.5 to about 7.9.

3. A method according to claim 2 wherein the pH of the composition is from about 7.6 to about 7.8.

4. A method according to claim 1 wherein the composition comprises from about 50 wt % to about 90 wt % propylene glycol, from about 5 wt % to about 20 wt % ammonium fluoride, and from about 10 wt % to about 30 wt % water.

5. A method according to claim 4 wherein the composition comprises from about 55 wt % to about 75 wt % propylene glycol, from about 8 wt % to about 18 wt % ammonium fluoride, and from about 15 wt % to about 25 wt % water.

6. A method according to claim 5 wherein the composition comprises from about 60 wt % to about 70 wt % propylene glycol, from about 10 wt % to about 15 wt % ammonium fluoride, and from about 18 wt % to about 22 wt % water.

7. A method according to claim 6 wherein the composition comprises about 65 wt % propylene glycol, about 14 wt % ammonium fluoride, and about 21 wt % water.

8. A method according to claim 1 wherein the pH of the composition results from the introduction of ammonia into the composition.

9. A method according to claim 1 wherein the composition further comprises a buffering agent.

10. A method as claimed in claim 1 wherein said contacting step is carried out at from about 22 to about 50° C.

11. A method for removing etch residues from a silicon substrate comprising contacting said silicon substrate with a composition comprising about 65 wt % propylene glycol, about 14 wt % ammonium fluoride, and about 21 wt % water, wherein said composition has a pH of from 7 to about 8.

12. A method for removing etch residues from a silicon substrate comprising contacting said silicon substrate with a composition comprising about 65 wt % propylene glycol, about 14 wt % ammonium fluoride, and about 21 wt % water, wherein said composition has a pH of from about 7.6 to about 7.8.

13. A composition comprising ammonium fluoride, propylene glycol, and water, wherein said composition has a pH of from 7 to about 8.

14. A composition according to claim 13 wherein the pH of the composition is from about 7.5 to about 7.9.

15. A composition according to claim 14 wherein the pH of the composition is from about 7.6 to about 7.8.

16. A composition according to claim 13 comprising from about 50 wt % to about 90 wt % propylene glycol, from about 5 wt % to about 20 wt % ammonium fluoride, and from about 10 wt % to about 30 wt % water.

17. A composition according to claim 16 comprising from about 55 wt % to about 75 wt % propylene glycol, from about 8 wt % to about 18 wt % ammonium fluoride, and from about 15 wt % to about 25 wt % water.

18. A composition according to claim 17 comprising from about 60 wt % to about 70 wt % propylene glycol, from about 10 wt % to about 15 wt % ammonium fluoride, and from about 18 wt % to about 22 wt % water.

19. A composition according to claim 18 comprising about 65 wt % propylene glycol, about 14 wt % ammonium fluoride, and about 21 wt % water.

20. A composition comprising about 65 wt % propylene glycol, about 14 wt % ammonium fluoride, and about 21 wt % water, wherein said composition has a pH of from 7 to about 8.

21. A composition according to claim 20 wherein the pH of the composition results from the introduction of ammonia into the composition.

22. A composition according to claim 20 wherein the composition further comprises a buffering agent.

23. A composition comprising about 65 wt % propylene glycol, about 14 wt % ammonium fluoride, and about 21 wt % water, wherein said composition has a pH of from about 7.6 to about 7.8.

24. A method for removing etch residues from a silicon substrate comprising contacting said silicon substrate with a composition comprising ammonium fluoride, propylene glycol, and at least about 10 wt % water for a period of time necessary to remove said etch residues, wherein said composition has a pH of from about 7 to about 8.

25. A composition comprising ammonium fluoride, propylene glycol, and at least about 15 wt % water, wherein said composition has a pH of from about 7 to about 8.

* * * * *